(12) United States Patent
Li et al.

(10) Patent No.: US 6,413,873 B1
(45) Date of Patent: Jul. 2, 2002

(54) SYSTEM FOR CHEMICAL MECHANICAL PLANARIZATION

(75) Inventors: Shijian Li, San Jose; John M. White, Hayward; Lawrence M. Rosenberg, San Jose; Martin Scales, San Jose; Ramin Emami, San Jose; James V. Tietz, Fremont; Manoocher Birang, Las Gatos, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/563,550

(22) Filed: May 3, 2000

Related U.S. Application Data

(60) Provisional application No. 60/132,174, filed on May 3, 1999, and provisional application No. 60/132,177, filed on May 3, 1999.

(51) Int. Cl.[7] .................. H01L 21/302; B24B 21/00; B24B 1/00; C23F 1/02
(52) U.S. Cl. .................. 438/711; 438/691; 438/692; 438/693; 438/745; 156/345; 451/36; 451/49; 451/51; 451/178; 451/286
(58) Field of Search .................. 438/711, 692, 438/691, 693, 745; 156/345; 451/41, 285, 287, 289, 59, 36, 178, 286

(56) References Cited

U.S. PATENT DOCUMENTS

| | | | | |
|---|---|---|---|---|
| 5,335,453 A | * | 8/1994 | Baldy et al. .................. | 51/67 |
| 5,692,947 A | * | 12/1997 | Talieh et al. .................. | 451/41 |
| 5,810,964 A | | 9/1998 | Shiraishi .................. | 156/345 |
| 6,149,506 A | * | 11/2000 | Duescher .................. | 451/59 |

FOREIGN PATENT DOCUMENTS

| | | | | |
|---|---|---|---|---|
| DE | 87 17 353.0 | | 2/1989 | .......... B24B/9/06 |
| EP | 0 517 594 A1 | | 12/1992 | .......... B24B/37/04 |
| EP | 0 733 437 A1 | | 9/1996 | .......... B24B/19/12 |
| FR | 0517594 A1 | * | 12/1992 | .......... H01L/21/00 |
| JP | 01281865 | | 11/1989 | .......... B24B/21/20 |
| WO | WO 97/20660 | | 6/1997 | .......... B24B/21/00 |
| WO | WO 98/45090 | | 10/1998 | .......... B24B/53/10 |
| WO | WO-9845090 | * | 10/1998 | .......... B24B/53/10 |

* cited by examiner

Primary Examiner—Matthew Smith
Assistant Examiner—Igwe U. Anya
(74) Attorney, Agent, or Firm—Moser, Patterson & Sheridan

(57) ABSTRACT

A semiconductor substrate processing system for polishing a substrate that generally includes a platen and a web of polishing material disposed thereon. Embodiments of the system include a disposable cartridge for housing the web of polishing material, a shield member disposed proximate the web for preventing contamination of the unused portion of the web, a fluid delivery for fixing and freeing the web from the platen, apparatus for controlling the lateral movement of the web, and an apparatus for providing more linear feet of polishing material per height of a roll.

3 Claims, 11 Drawing Sheets

SYSTEM FOR CHEMICAL MECHANICAL PLANARIZATION

This application claims benefit of U.S. Provisional Application No. 60/132,174, filed May 03, 1999, and U.S. Provisional Application No. 60/132,177, filed May 03, 1999. Both of which are hereby incorporated by reference in their entirety.

BACKGROUND OF THE DISCLOSURE

1. Field of Invention

The present invention relates generally to a processing system for polishing a substrate.

2. Background of Invention

In semiconductor wafer processing, the use of chemical mechanical planarization, or CMP, has gained favor due to the enhanced ability to increase device density on a semiconductor workpiece, or substrate, such as a wafer. As the demand for planarization of layers formed on wafers in semiconductor fabrication increases, the requirement for greater system (i.e., process tool) throughput with less wafer damage and enhanced wafer planarization has also increased.

Two exemplary CMP systems that address these issues are described in U.S. Pat. No. 5,804,507, issued Sep. 8, 1998 to Perlov et al. and in U.S. Pat. No. 5,738,574, issued Apr. 15, 1998 to Tolles et al. Perlov et al. and Tolles et al. disclose a CMP system having a planarization system that is supplied wafers from cassettes located in an adjacent liquid filled bath. A transfer mechanism, or robot, facilitates the transfer of the wafers from the bath to a transfer station. The transfer station generally contains a load cup that positions wafers into one of four processing heads mounted to a carousel. The carousel moves each processing head sequentially over the load cup to receive a wafer. As the processing heads are loaded, the carousel moves the processing heads and wafers through the planarization stations for polishing. The wafers are planarized by moving the wafer relative to a polishing pad in the presence of a slurry or other polishing fluid medium. The polishing pad may include an abrasive surface. The slurry typically contains both chemicals and abrasives that aid in the removal of material from the wafer. After completion of the planarization process, the wafer is returned back through the transfer station to the proper cassette located in the bath.

Generally, slurries that contain abrasive particles have a number of undesirable aspects. For example, the abrasive particles entrained in the slurry may settle, thus changing the concentration of abrasive particles within the slurry. Additionally, the abrasives within the slurry wear and erode pumping mechanisms and related plumbing, requiring periodic maintenance and replacement while diminishing the service life of the system and components. Furthermore, slurry that dries on the tool surfaces is difficult to remove, and may become a source of unwanted particulate matter that may interfere with polishing operations or damage the surfaces of the wafer.

One solution eliminates the use of abrasive particles within the slurry by incorporating a plurality of fixed abrasive elements in the polishing pads. Generally, the fixed abrasive elements contain abrasive particles held in a binder that is disposed on a web of backing material. During a preconditioning operation, a portion of the binder is removed to expose some to the abrasive particles. The exposed abrasive particles supply the mechanical component of the polishing process. As the methodologies for preconditioning have not been fully developed, care must be taken not to remove excessive pad material. Examples of such fixed abrasive pads are described in U.S. Pat. No. 5,692,950, by Rutherford et al. (issued Dec. 2, 1997) and U.S. Pat. No. 5,453,312, by Haas et al. (issued Sep. 26, 1995). Typically, a polishing fluid (without abrasive particles) is used in concert with the fixed abrasive pad to provide the chemical component of the polishing process.

Therefore, there is a need in the art for a system that that advantageously utilizes fixed abrasive pads to polish substrates in a chemical mechanical polishing system.

SUMMARY OF INVENTION

Generally, the present invention provides a system and method for planarizing a substrate. In one embodiment, the invention provides a polishing media assembly comprising a shaft having at least a portion of a web of polishing material wound thereon. The shaft is disposed in a housing substantially enclosing the shaft. The housing has an aperture adapted to have the web disposed therethrough.

In another embodiment, a substrate polishing system includes at least one polishing head disposed above a polishing platen. The polishing platen has a least a portion of a web of polishing material disposed thereon. At least a second portion of the polishing material is wound about a shaft that is substantially enclosed by a housing. The housing has an aperture through which the web between the first and second portion is disposed.

In another embodiment, an apparatus for substrate polishing includes a web of polishing material having at least a first portion disposed on a polishing platen. A shield member is disposed adjacent the polishing platen and defines a slot therebetween. The web is disposed through the slot. The slot prevents contamination from becoming disposed on the unused portion of the web.

In another embodiment, an apparatus for semiconductor substrate polishing includes a web of polishing material having at least a portion disposed on a polishing platen. The web is disposed on at least one roller having a means for preventing lateral movement of the web.

In another embodiment, an apparatus for semiconductor substrate polishing includes a web of polishing material having at least a first portion disposed on a polishing platen. A port is disposed in the platen beneath the first portion and is adapted to supply both vacuum and pressure between the first portion of the web and the polishing platen.

In another embodiment, a polishing media assembly includes a first roller and a second roller disposed adjacent the first roller. A web of polishing material is wound in a single roll about the first and the second rollers.

In another embodiment, an apparatus for semiconductor substrate polishing includes a web of polishing material having at least a first portion disposed on a polishing platen. A polishing head is disposed proximate the platen. The polishing head and the platen vibrate relative one another.

In another aspect, a method for processing a workpiece is also disclosed. In one embodiment, the method includes the steps advancing a web of polishing material contained in a housing and vibrating a polishing platen relative a polishing head.

BRIEF DESCRIPTION OF DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION OF INVENTION

Figure 1:
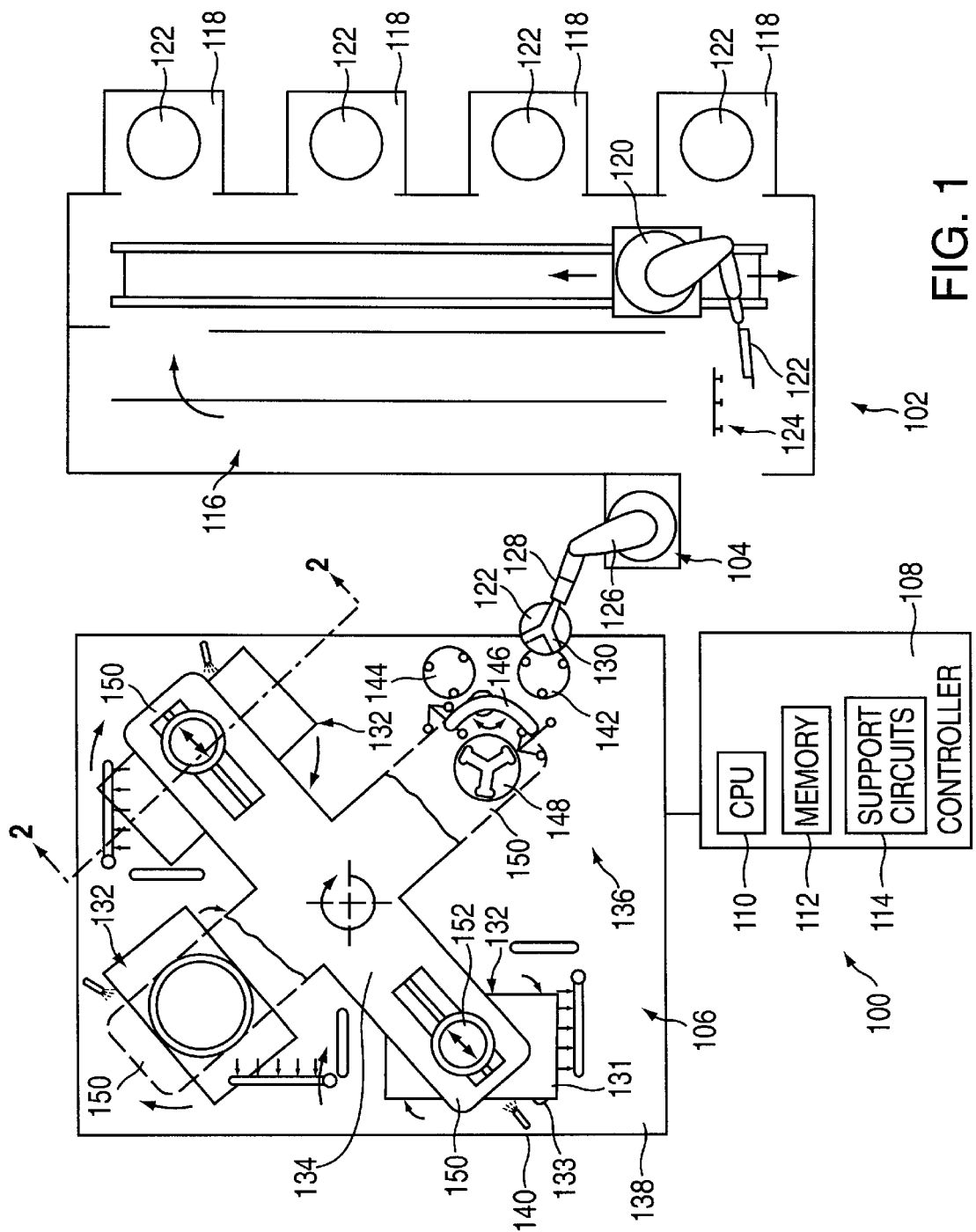
FIG. 1 is a plan view of a chemical mechanical planarization system of the invention.

FIG. 1 depicts a plan view of a chemical mechanical planarization system 100. The exemplary system 100 generally comprises a factory interface 102, a loading robot 104, and a polishing module 106. Generally, the loading robot 104 is disposed proximate the factory interface 102 and the polishing module 106 to facilitate the transfer of substrates 122 therebetween.

A controller 108 is provided to facilitate control and integration of the modules comprising the system 100. The controller 108 comprises a central processing unit (CPU) 110, a memory 112, and support circuits 114. The controller 108 is coupled to the various components of the system 100 to facilitate control of, for example, the polishing, cleaning and transfer processes.

The factory interface 102 generally includes a cleaning module 116 and one or more wafer cassettes 118. An interface robot 120 is employed to transfer substrates 122 between the wafer cassettes 118, the cleaning module 116 and an input module 124. The input module 124 is positioned to facilitate transfer of substrates 122 between the polishing module 106 and the factory interface 102 by the loading robot 104. For example, unpolished substrates 122 retrieved from the cassettes 118 by the interface robot 120 may be transferred to the input module 124 where the substrates 122 may be accessed by the loading robot 104 while polished substrates 122 returning from the polishing module 106 may be placed in the input module 124 by the loading robot 104. Polished substrates 122 are typically passed from the input module 124 through the cleaning module 116 before the factory interface robot 120 returns the cleaned substrates 122 to the cassettes 118. An example of such a factory interface 102 that may be used to advantage is disclosed in U.S. Provisional Patent Application serial No. 60/139,222, filed Jun. 15, 1999.

The loading robot 104 is generally positioned proximate the factory interface 102 and the polishing module 106 such that the range of motion provided by the robot 104 facilitates transfer of the substrates 122 therebetween. An example of a loading robot 104 is a 4-Link robot, manufactured by Kensington Laboratories, Inc., located in Richmond, Calif.

The exemplary loading robot 104 has an articulated arm 126 having a rotary actuator 128 at its distal end. An edge contact gripper 130 is coupled to the rotary actuator 128. The rotary actuator 128 permits the substrate 122 secured by the gripper 130 to be orientated in either a vertical or a horizontal orientation without contacting the feature side 120 of the substrate 122 and possibly causing scratching or damage to the exposed features. Additionally, the edge contact gripper 130 securely holds the substrate 122 during transfer, thus decreasing the probability that the substrate 122 will become disengaged. Optionally, other types of grippers, such as electrostatic grippers, vacuum grippers and mechanical clamps, may be substituted.

One polishing module 106 that can be used to advantage with the present invention is a REFLEXIONS™ Chemical Mechanical Polisher, manufactured by Applied Materials, Inc., located in Santa Clara, Calif. Other polishing modules 102 including those that use polishing pads, polishing webs, or a combination thereof may also be used to advantage. Other systems that benefit include systems that move a substrate relative a polishing surface in a rotational, linearly or in other motion within a plane.

The exemplary polishing module 106 has a transfer station 136, a plurality of polishing stations 132 and a carousel 134 disposed on an upper or first side 138 of a machine base 140. In one embodiment, the transfer station 136 comprises at least an input buffer station 142, an output buffer station 144, a transfer robot 146, and a load cup assembly 148. The loading robot 104 places the substrate 122 onto the input buffer station 142. The transfer robot 146 has two gripper assemblies, each having pneumatic gripper fingers that grab the substrate 122 by the substrate's edge. The transfer robot 146 lifts the substrate 122 from the input buffer station 142 and rotates the gripper and substrate 122 to position the substrate 122 over the load cup assembly 148, then places the substrate 122 down onto the load cup assembly 148. An example of a transfer station that may be used to advantage is described by Tobin in U.S. patent application Ser. No. 09/314,771, filed Oct. 6, 1999.

The carousel 134 is generally described by Tolles in the previously mentioned U.S. Pat. No. 5,804,507. Generally, the carousel 134 is centrally disposed on the base 140. The carousel 134 typically includes a plurality of arms 150, each supporting a polishing head assembly 152. Two of the arms 150 depicted in FIG. 1 are shown in phantom such that a polishing surface 131 of one of the polishing stations 132 and the transfer station 136 may be seen. The carousel 134 is indexable such that the polishing head assemblies 152 may be moved between the polishing stations 132 and the transfer station 136.

Figure 2:
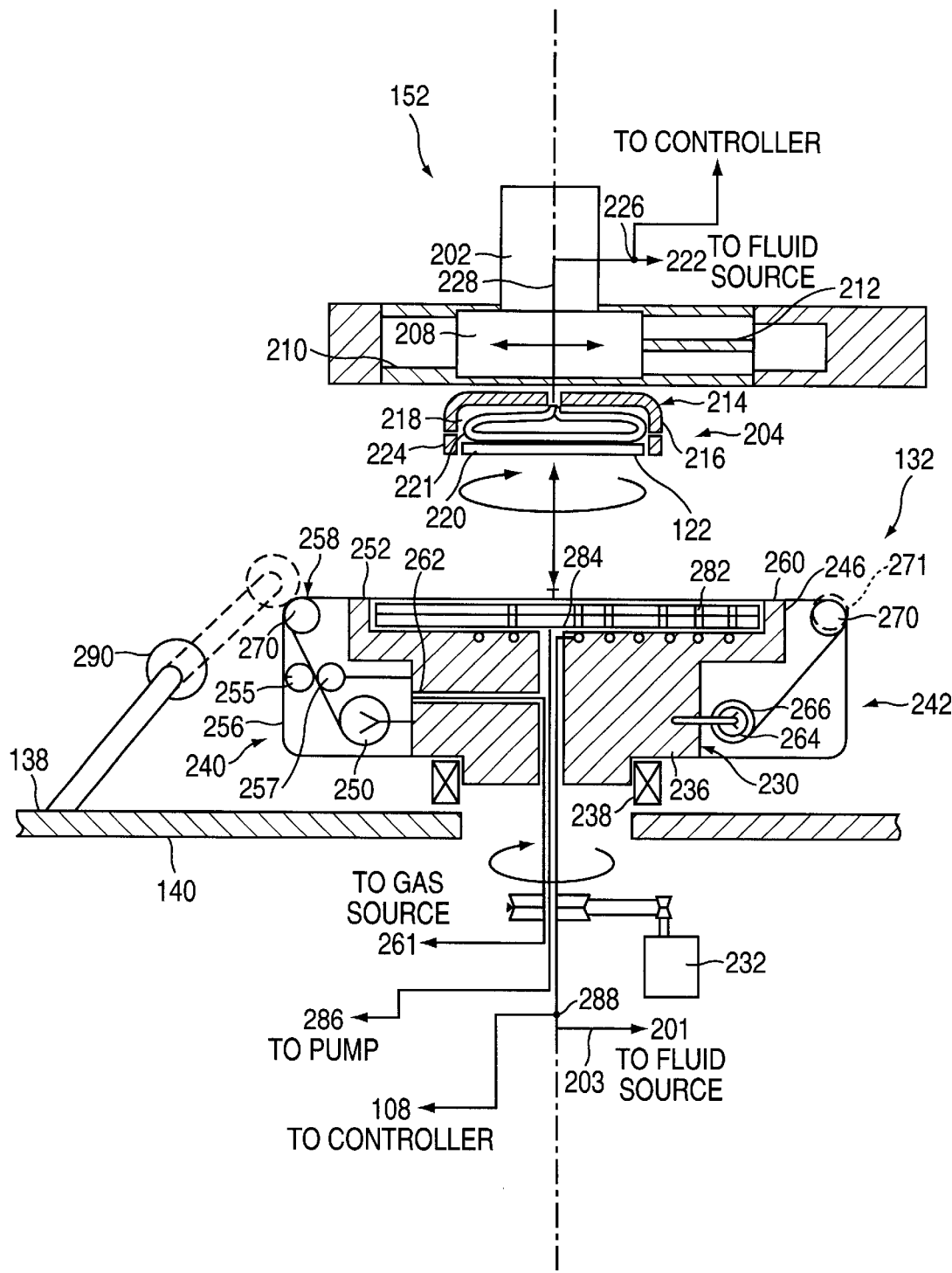
FIG. 2 is a sectional view of a polishing station taken along section line 2—2 of FIG. 1.

FIG. 2 depicts a sectional view of the polishing head 204 assembly 152 supported above the polishing station 132. The polishing head 204 assembly 152 generally comprises a drive system 202 coupled to a polishing head 204. The drive system 202 generally provides rotational motion to the polishing head 204. The polishing head 204 additionally may be actuated to extend towards the polishing station 132 such that the substrate 122 retained in the polishing head 204 may be disposed on the polishing station 132.

The drive system 202 is coupled to a carrier 208 that translates upon a rail 210 disposed in the arm 150 of the carousel 134. A ball screw or other linear motion device 212 couples the carrier 208 to the carousel 134 and positions the drive system 202 and polishing head 204 along the rail 210.

In one embodiment, the polishing head 204 is a TITAN HEAD™ wafer carrier manufactured by Applied Materials, Inc., Santa Clara, Calif. Generally, the polishing head 204 comprises a housing 214 having an extending lip 216 that defines a center recess 218 in which is disposed a bladder 220. The bladder 220 may be comprised of an elastomeric material or thermoplastic elastomer such as ethylene propylene, silicone and HYTREL™. The bladder 220 is coupled to a fluid source 222 such that the bladder 220 may be controllably inflated or deflated. The bladder 220, when in contact with the substrate 122, retains the substrate 122 within the polishing head 204 by deflating, thus creating a vacuum between the substrate 122 and the bladder 220. A fluid source (not show) is typically disposed within the center recess 218 to wet the bladder 220. The fluid assists in retaining the substrate 122 to the bladder 220 by enhancing to seal between the substrate 122 and the bladder 220 when a vacuum is applied. Additionally, the fluid between the bladder 220 and the substrate 122 provides surface tension that helps retain the substrate 122 to the bladder 220. A retaining ring 224 circumscribes the polishing head 204 to retain the substrate 122 within the polishing head 204 while polishing.

The polishing station 132 generally comprises a platen 230 that is rotationally disposed on the base 140. The platen 230 is generally comprised of aluminum or other corrosion resistant material. The platen 230 is supported above the base 140 using bearing 238. The inner area of the bearing 238 is open and provides a conduit for the electrical, mechanical, pneumatic, control signals and connections communicating with the platen 230.

Conventional bearings, rotary unions and slip rings (not shown) are provided such that electrical, mechanical, pneumatic, control signals and connections may be coupled between the base 140 and the rotating platen 230. The platen 230 is typically coupled to a motor 232 that provides the rotational motion to the platen 230.

The platen 230 has an upper portion 236 supported by a hollow shaft 238 that couples the platen 230 to the base 140. The shaft 238 Generally, the upper portion 236 is circular when using "stick-down" or adhesive backed polishing surfaces, or rectangular when using polishing surfaces disposed on a web.

In one embodiment, the upper portion 236 of the platen 230 is rectangular, having opposing short sides 244, 246. An unwind station 240 and a take-up station 242 are disposed on the short side 244 and the short side 246, respectively. The unwind station 240 has a shaft receiver 248 that supports a shaft or unwind reel 250 on which a polishing material 252 is wound. Generally, the unused portion of the polishing material 252 is stored on the unwind reel 250 prior to processing.

Figure 3:
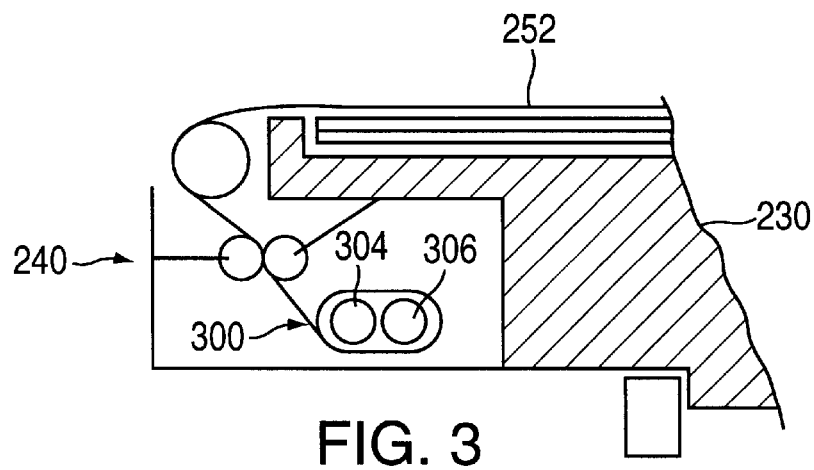
FIG. 3 is partial sectional view of a polishing station depicting an elongated roll of polishing material.

FIG. 3 depicts an alternate embodiment of an unwind reel 302. The unwind reel 302 may comprise a first roller 304 and a second roller 306 on which the polishing material 252 is wound to form a single roll. The polishing material 252, when unwound from the unwind reel 302, causes the first roller 304 and the second roller 306 to turn about their central axis's, respectively (i.e., the first roller 304 and the second roller 306 remain stationary with respect to the platen 230). Alternatively, a core (not shown) may be disposed around the first roller 304 and the second roller 306. The core may remain stationary or turn with the polishing material 252 being removed from the unwind reel 302. When used with the core, the first roller 304 and the second roller 306 may rotate or remain stationary. Having the polishing material 252 wound between the first roller 304 and the second roller 306 allows more linear feet of polishing material 252 to be wound upon the unwind reel 302 per height "X" of the roll than could be wound on a single circular shaft.

Returning to FIG. 2, a housing, or shield member 256, generally comprised of a non-corrosive material, is disposed over the unwind station 240 and encloses the reel 250 containing the polishing material 252. An idler 255 is coupled to the shield member 256 such that when the shield member 252 is in a closed position, the idler 255 pinches the polishing material 252 against an drive wheel 257 coupled to the platen 230. The drive wheel 257 is used to pull polishing material 252 from the reel 250. An encoder (not shown) is coupled to the drive wheel 257. The encoder is coupled to the controller 108 to monitor the movement of the polishing material 252 (i.e., control the amount of polishing material indexed).

A portion of the polishing material 252 is disposed across a top surface 260 of the upper portion 236 of the platen 230 between the unwind station 240 and the take-up station 242. A pair of rollers 270 are disposed at the short sides 244, 246 of the platen 230 such that the polishing material 252 may be moved across the top surface 260 without chafing on the edges of the platen 230. Optionally, the rollers 270 may be replaced by a radius on the top surface 260 that minimizes the chafing of the polishing material 252.

A gap 258 is defined between the shield member 256 and the polishing material 252 disposed on the roller 170. A gas supply port 262 is disposed in the platen 230. The port 262 places the area enclosed by the shield member 256 in communication with a gas source 261. The gap 258 is configured to permit gas (e.g., air) supplied through the port 262 to escape through the gap 258. The air passing through the gap 258 prevents contaminants, such as polishing chemicals and polishing byproducts, from entering 224 through the gap 258 and becoming deposited on the polishing material 252 where they may later damage the substrate 122 during polishing.

Figure 4:
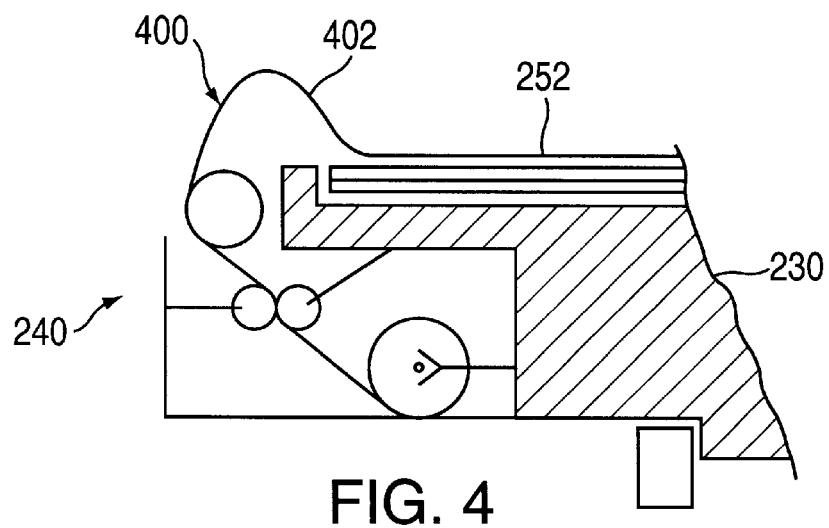
FIG. 4 is partial sectional view of another embodiment of a polishing station.

As depicted in FIG. 4, fluid contamination may be prevented from entering the unwind station 240 by creating a web dam 400. The web dam 400 is formed by advancing a portion 402 of polishing material 252 from the unwind station 240 after the polishing material 252 has been secured to the platen 240. The advanced portion 402 forms a ridge of material elevated above the plane of the polishing material 252 secured to the platen 240 whereon the polishing process is performed. Thus, fluids, polishing byproducts and other debris, moving outwards form the platen 240 as it rotates, are stopped by the ridge formed by the advanced portion 402 from entering the unwind station 240. Alternatively, a member (not shown) projecting from the platen may form the web dam 400.

Figure 5:
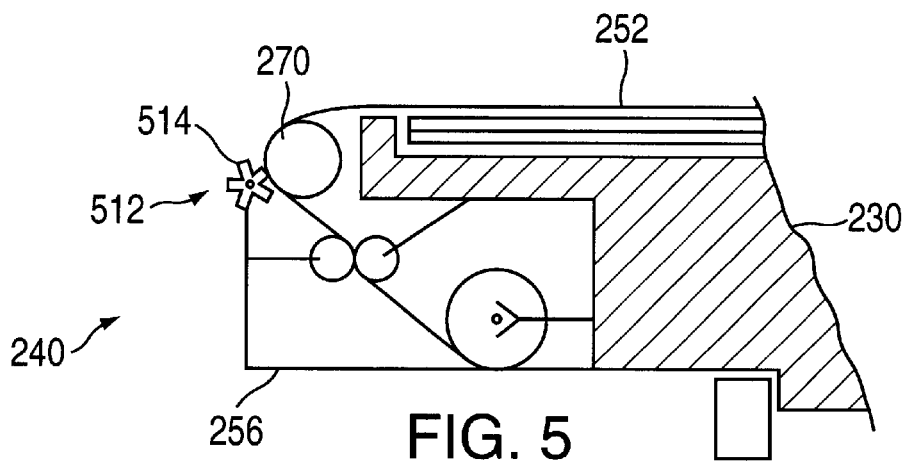
FIG. 5 is partial sectional view of another embodiment of a polishing station.

FIG. 5 depicts an alternate embodiment of an unwind station 510. The unwind station 510 is similarly configured to the unwind station 240 described with reference to FIG. 2. The unwind station 510 additionally comprises a wiper 512 disposed against the polishing material 252. Generally, the wiper 512 is positioned such that contamination or fluids used in the polishing process may not enter the unwind station 510. The wiper 512 may be coupled to the platen 240 or alternatively coupled to the shield member 256. The wiper 512 typically comprises a plastic or elastomeric sheet or roller. In one embodiment, the wiper 512 comprises a roller having a plurality of fingers 514 extending radially outwards. As the polishing material 252 advances, at least one of the fingers 514 maintains contact with the polishing material, thus maintaining the barrier to contamination.

Returning to FIG. 2, the take-up station 242 is similarly configured to the unwind station 240. The take-up station 242 additionally comprises a tensioning device 264, interfacing with, or integral to a take-up reel 266, that maintains a predetermined tension between the unwind and take-up reels 250, 266. The tensioning device 264 may include a constant force mechanism or alternatively, a servo or stepper motor.

Generally, the polishing material 252 is indexed across the upper portion 236 of the platen 230 between polishing substrates. Typically, the drive wheel 257 pulls an adjustable (through feed back from the encoder), predetermined length of unused polishing material 252 (typically between about 0.05 to 1.0 inches) off the unwind reel 250. As a corresponding length of used polishing material 252 is wound on the take-up reel 266 by the tensioning device 264, the portion of the polishing material 252 disposed on the upper portion 236 of the platen 230 is advanced by the predetermined length towards the take-up station 242. Alternatively, the drive wheel 257 and tensioning device 264 may advance the polishing material 252 in discrete lengths or continuously across the platen 230 during polishing.

Optionally, the drive wheel 257 may index the polishing material 252 using a slow, continuous movement, rather than periodic movement. The index may occur during or between polishing. A tractor feed can be provided for implementation to move the web slowly underneath the wafer as the wafer and platen are both going round and round during polishing so it continuously refreshes with an attendant control over the rate of movement. Alternatively, the movement may be rapid linear movement. In the case of this type of polishing, it is desirable for the relative motion between the wafer and the web, or the wafer and the abrasive material, to be in range of about half to one meter per second. The index is slow relative to the wafer polishing motion. When the index occurs during polishing, the movement is slow relative to the round and round, e.g., at least a factor slower than half meter per second, such as a tenth of a meter per second.

The top surface 260 of the platen 230 contains a center recess 276 formed therein. A subpad 278 and a subplate 280 are disposed in the center recess 276. The subpad 278 is typically a plastic, such as foamed polyurethane, having a durometer selected to produce a particular polishing result. The subpad 278 generally conforms to the plane of the substrate 122 held in the polishing head 204 and promotes global planarization of the substrate 122. The subplate 280 is positioned between the subpad 278 and the bottom of the recess 276 such that the upper surface of the subpad 278 is coplanar with the top surface 260 of the platen 230.

Optionally, the subpad 278 may include a local stiffener to provide local planarity for the high spots. In this way, conformity is achieved on a large scale and on a local scale. A thin stiffening layer can be provided to achieve flexibility over a great distance. As by replacing the squishy pad with a stiffer material. Other aspects include using a stiff material for the backing sheet.

Both the subpad 278 and the subplate 280 optionally contain a plurality of apertures 282 that are generally disposed in a pattern such that the polishing motion of the substrate 122 does not cause a discrete portion of the substrate 122 to pass repeatedly over the apertures 282 while polishing as compared to the other portions of the substrate 122. A vacuum port 284 is provided in the recess 276 and is coupled to an external pump 286. When a vacuum is drawn through the vacuum port 284, the air removed between the polishing material 252 and the subpad 278 causes the polishing material 252 to be firmly held to the subpad 278 during polishing. An example of such polishing material retention system is disclosed in U.S. patent application Ser. No. 09/258,036, filed Feb. 25, 1999, by Sommer et al. The reader should note that other types of devices may be utilized to fix the polishing material 252 to the platen 230, for example adhesives, bonding, electrostatic chucks, mechanical clamps and other retention mechanisms.

To release the polishing material 252 from the subpad 278 prior to advancing the polishing material 252, surface tension caused by fluid that may be disposed between the subpad 278 and the polishing material 252 must be overcome. The pump 286 is generally configured to provide a blast of gas (e.g., air) through the vacuum port 284 or other port (not shown) into the recess 276. The air pressure within the recess 276 moves through the apertures 282 disposed in the subpad 278 and subplate 280 and lifts the polishing material 252 from the subpad 278 and the top surface 260 of the platen 230. The polishing material 252 rides upon the cushion of air such that it may be freely indexed across the platen 230. Alternatively, the subpad 278 may be a porous material that permits gas (e.g., air) to permeate therethrough and lift the polishing material 252 from the platen 230.

Optionally, one or both of the rollers 270 may be positioned such that a perimeter 271 of the roller projects above the top surface 260 of the platen. When the polishing material 252 is lifted off the subpad 278 by applying air beneath the polishing material, the projecting rollers 270 provides additional clearance between the polishing material 252 and the subpad 278. The additional clearance between the polishing material 252 and subpad 278 reduces the likelihood of contact (and the creation of surface tension forces) between the polishing material 252 and the subpad 278 during advancement of the polishing material 252.

The polishing material 252 may comprise a polishing pad or web having a smooth surface, a textured surface, a surface containing a fixed abrasive or a combination thereof. The polishing material 252 may be in the form of a roll or sheet of material. Optionally, the polishing material 252 may be releasably fixed, by adhesives, vacuum, mechanical clamps or by other holding methods to the platen 230.

Generally, polishing pads with and without fixed abrasives may be utilized. Polishing pads without fixed abrasives are generally comprised of polyurethane and used with polishing fluids that include abrasives. Conventional pads (i.e., pads without fixed abrasives) are available from Rodel, Inc., of Newark, Del.

In one embodiment the polishing material 252 comprises a web of backing material having a plurality of polishing elements disposed thereon. The backing material is generally a flexible material, such as mylar. Each polishing element comprises a plurality of abrasive particles entrained in a binder. As the binder is removed by a conditioning device or during the polishing process, abrasive particles become exposed, providing the mechanical component of the polishing process. An example of such a polishing web is described in the previously mentioned patents U.S. Pat. No. 5,692,950, by Rutherford et al. and U.S. Pat. No. 5,453,312, by Haas et al.

Figure 6:
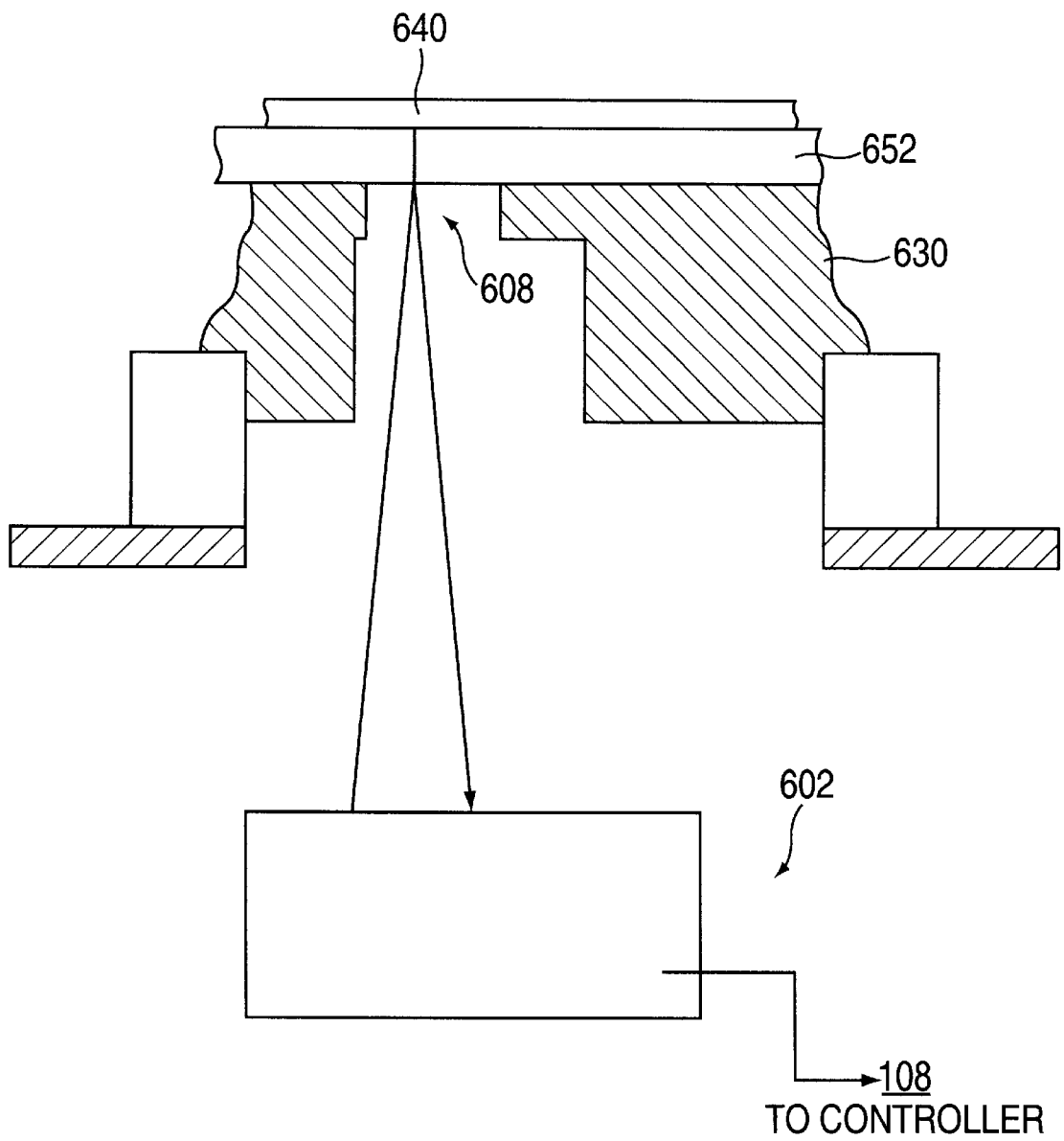
FIG. 6 is a partial view of a polishing station depicting an optical monitoring system.

FIG. 6 depicts a portion of the polishing material 652 disposed on a platen 630 that includes an optical monitoring system 602 that is coupled to the controller 108. The monitoring system 602 is basically a laser that shines up at the substrate and then reflects back down again. As the film on the substrate gets thicker and thinner, the reflective intensity changes in a characteristic way to enable accurate measurement of the film thickness during CMP by providing sensors. The present invention provides a sealed window 608 in the platen 630. An optical monitoring system that may be used to advantage is described in U.S. patent application Ser. No. 08/689,930 (filed Aug. 16, 1996), by Birang et al.

Returning to FIG. 1, a plurality of rinse arms 154 are disposed adjacent to the polishing stations 132. At least one of the rinse arms 154 is disposed adjacent each polishing station 132. The rinse arm 154 generally includes two or more supply tubes (not shown) that deliver a polishing fluid and a cleaning fluid, respectively, to a plurality of nozzles 156 positioned along the rinse arm 154. The each of the nozzles 156 may be adapted to deliver the polishing fluid, the cleaning fluid, or both the polishing and cleaning fluids. The polishing fluid may comprise a slurry or a liquid, and include chemical polishing agents, de-ionized water or a combination thereof. Additionally, abrasive particles may optionally be included in the polishing fluid. The cleaning fluid typically comprises de-ionized water although other fluids may be used.

Generally, the rinse arm 154 is actuated such that the nozzles 156 may wet typically the entire polishing surface 131 of the polishing station 132 with either the polishing fluid or the cleaning fluid. In one embodiment, the rinse arm delivers de-ionized water between each polishing operation (i.e., between each substrate 122). The cleaning fluid removes the any debris, loose material or other contamination from between the abrasive elements or from the upper surface of the polishing material 252.

An example of rinse arms that may be used to advantage are disclosed in U.S. patent application Ser. No. 09/244,456 (filed Feb. 4, 1999) by Birang et al., and in U.S. patent application Ser. No. 09/512,745 (filed Feb. 24, 2000) by Shijian Li et al.

In another embodiment, the rinse arm 154 provides polishing fluid that includes one or more chemical agents such as oxidizers, complexing agents, inhibitors, solublizers, buffers or de-ionized water. Alternatively, slurries that may contain abrasives may be provided. Generally, the polishing fluids provide the chemical component (i.e., the chemical activity) of the polishing process. Abrasives, either in the polishing fluid or on the fixed abrasive pad, provide the mechanical component of the polishing process.

For example, when polishing copper using a fixed abrasive pad, the polishing fluid generally includes an oxidizer that forms CuO on the surface of the copper. A complexing agent in the polishing fluid, such as $NH_3$, bonds with the CuO to form $Cu(NH_4)_x$, where x is 1–6. Additionally, an inhibitor, such as BTA, is provided that also bonds with the CuO, competing with the complexing agent for sites on the Cuo surface. As $Cu(NH_4)_x$ is relatively soluble, this compound moves from the surface of the copper and into solution, while the BTA-CuO compound remains relatively stable on the surface of the copper. Thus, the rate of chemical removal of copper from the surface may be controlled by controlling the ratio of the inhibitors to complexing agents. Generally, since the CuO is harder than the abrasive particles, polishing the pad only removes CuO that has reacted with the inhibitors or the complexing agents to form other compounds.

Optionally, a vibrational energy source or transducer 133 may apply energy to the polishing surface 131 during the polishing operation. The applied energy provides a microscopic motion (i.e., a vibration) as compared to the conventional polishing motion. The transducer 133 may couple the energy relate to the polishing surface 131 through either the polishing station 132 or the polishing head assembly 152 (the transducer 133 is shown coupled polishing station 132).

Generally, the transducer 133 causes the polishing surface 131 to vibrate by applying a high frequency, small amplitude vibration relative the polishing surface 131 and substrate 122. The vibration frequency may range from about 10 to about 1000 mHz. In one embodiment, the transducer 133 is an electric actuator. The transducer 131 may be selected with various or adjustable frequencies to applied energy at about a one meter per second movement relative the polishing surface 131 and substrate 122. The applied energy may provide a sinusoidal X and a sinusoidal Y displacement. The X and Y displacements may create a circular, or orbital motion. Alternatively, the applied energy may product motion in one direction.

Figure 7:
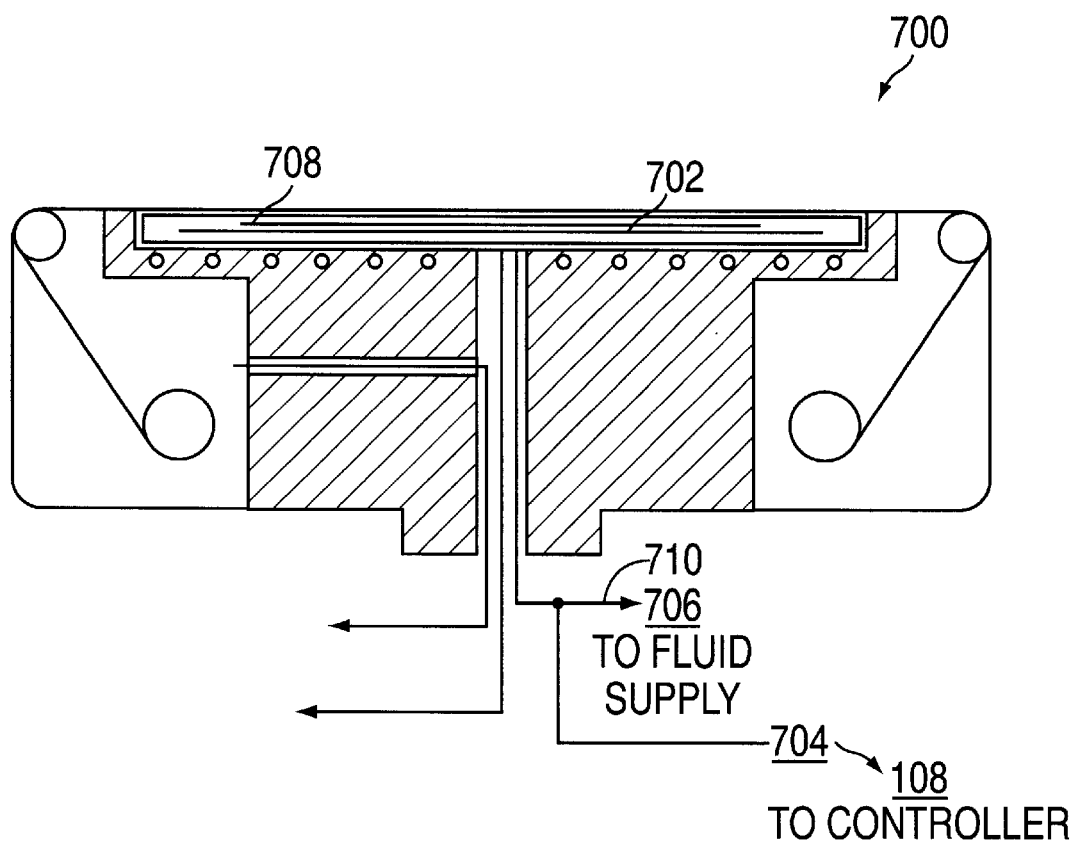
FIG. 7 is another view of a polishing station depicting a bladder subpad.

FIG. 7 depicts an alternate embodiment of a polishing station 700. The polishing station 700 is configured similarly to the polishing station 132 described with reference to FIG. 2, except the polishing pad and subplate are replaced by a subpad bladder 702. The subpad bladder 702 is coupled to a fluid supply 706. A sensor 704 is coupled to the subpad bladder 702 or a supply line 710 positioned between the subpad bladder 702 and supply 706 and provides an indicia of bladder pressure to the controller 108. The pressure of the subpad bladder 702 may be regulated to control the stiffness of the subpad bladder 702 and conformity of the polishing surface. Generally, the subpad bladder 702 is fabricated from an elastomeric or thermoplastic elastomer such as ethylene propylene, silicone and HYTREL™.

Optionally, the subpad bladder 702 may be in the form of a movable belt. The belt can be free wheeling or co-driven. One of the potential weaknesses of reel to reel architecture is that the front of the surface which carries the process weight when placed into the take up reel puts that process weight onto the back of the next rack. Therefore, the web is rolled up, it contaminates the back of the next wrap of the web. When the direction of the reel is reversed to obtain the next flight of linear polishing, the contaminated backside comes in contact with the belt that is providing the backing force under the wafer and contaminates the belt. Since the belt is a much shorter length than the entire reel, that contamination of the belt touches the web material all along its length so it basically tracks the contamination along the entire length of the reel to reel material. This embodiment solves that problem by using a reel to reel backside instead of the belt as well, and making it substantially the same length as the web material to eliminate this tracking mechanism. Front to back transfer of contamination occurs, but spreading of that contamination throughout the entire system is avoided.

Figure 8:
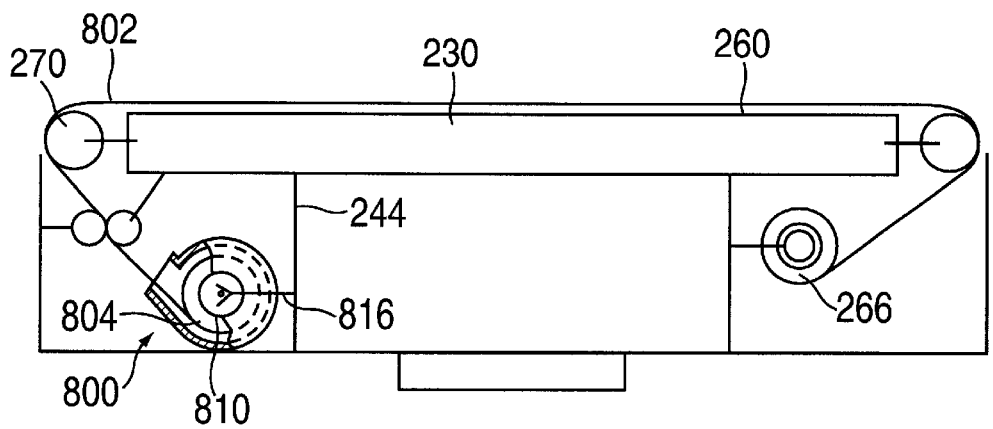
FIG. 8 is a view of a polishing station depicting a polishing media cartridge.
Figure 9A:
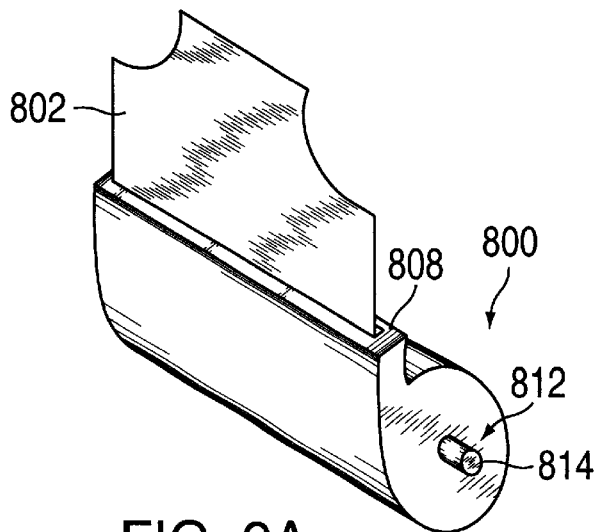
FIGS. 9A and 9B are perspective views of the polishing media cartridge of FIG. 8.
Figure 9B:
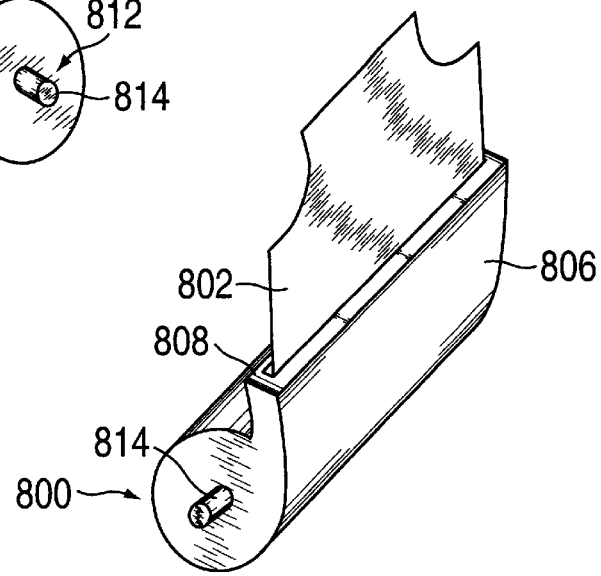

FIGS. 8, 9A and 9B depict a polishing media assembly 800 that includes a web 802 of polishing material and an unwind reel 804 consolidated into a single, disposable or recyclable assembly. The polishing media assembly 800 include the web 802 of polishing material wound on the shaft or unwind reel 804 (shown in phantom). Optionally, the unwind reel 804 may include a first roller and a second roller (not shown) upon which the web 802 is wound to form a single roll as described with reference to FIG. 3. The web 802 and unwind reel 804 are housed within a cartridge 806 having an aperture 808 through which the web 802 is disposed. Generally, the cartridge 806 is positioned adjacent the short side 244 where the web 802 may be fed over the roller 270 and across the top surface 260 of the platen 230 to the take-up reel 266. The cartridge 806 is generally comprised of a recyclable material such as a plastic.

An idler 810 is disposed in the cartridge 806. A drive wheel 811 is coupled the platen 830 and is positioned to pinch the web 802 between the idler 810 and wheel 811 when the cartridge 806 is disposed on the platen 830. The drive wheel 811 is coupled to the controller 108 so that the amount of web 802 advanced by the wheel 811 may be controlled.

The cartridge 806 typically includes a mounting member (s) 812 disposed on the ends of the assembly 800. The mounting member(s) 812 generally interfaces with the platen 230 to removably secure the assembly 800 to the platen 230. In one embodiment, the mounting member(s) 812 comprises a shaft 814 extending from the cartridge 806 which interfaces with a shaft holder 816 coupled to the platen 230. The mounting member(s) 812 may incorporate other geometry disposed on, or incorporated into, the cartridge 806 that removably fixes the assembly 800 relative the platen 230 such that the web 802 may be suitably disposed across the top surface 260 to the take-up reel 266. Examples of such mounting means include bores, protrusions, circumferential clamps, snap fits, vacuum clamps, mechanical clasps, fasteners and the like.

Figure 10:
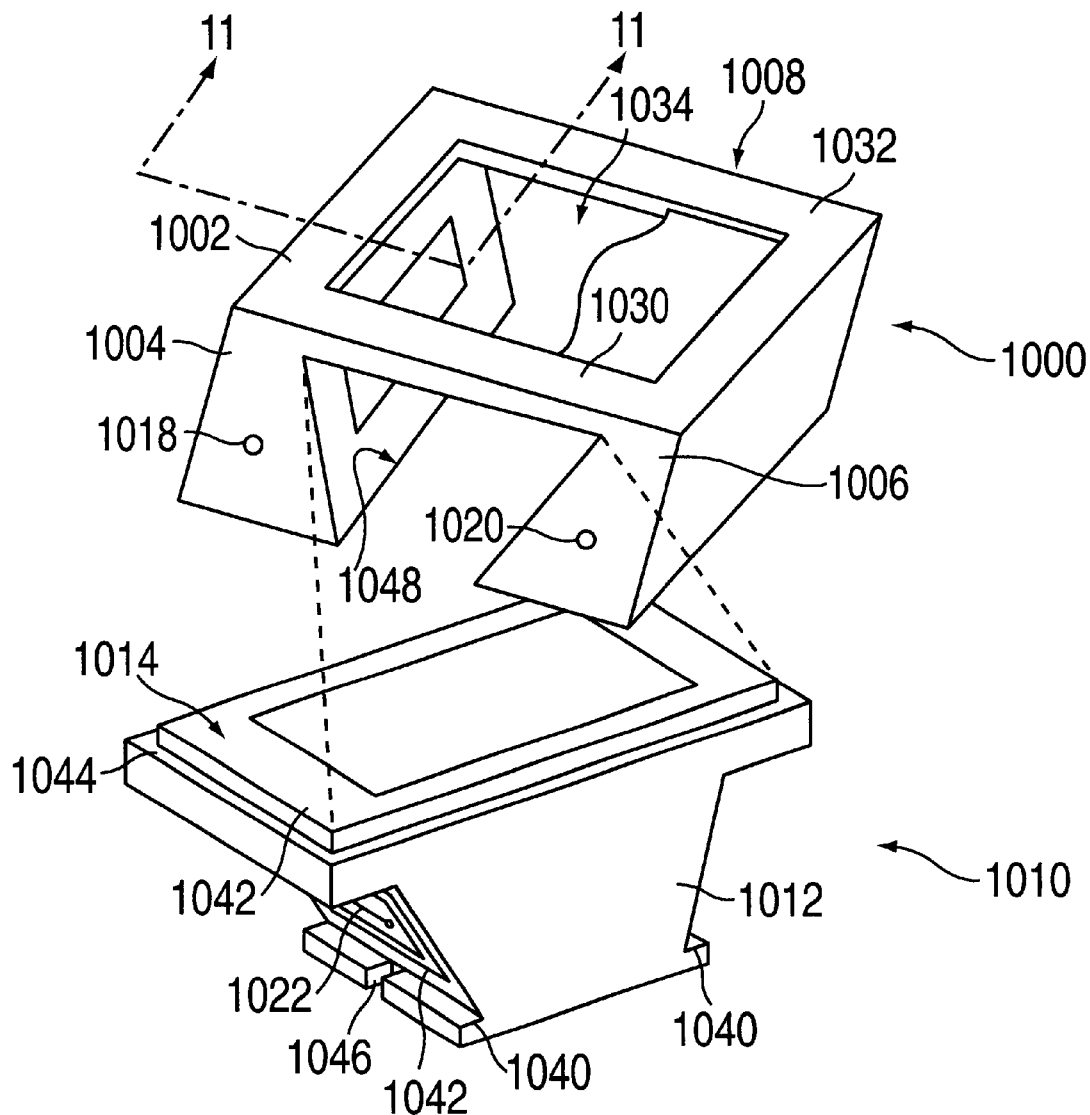
FIG. 10 is an exploded perspective view of another embodiment of a polishing media cartridge and a polishing station.
Figure 11:
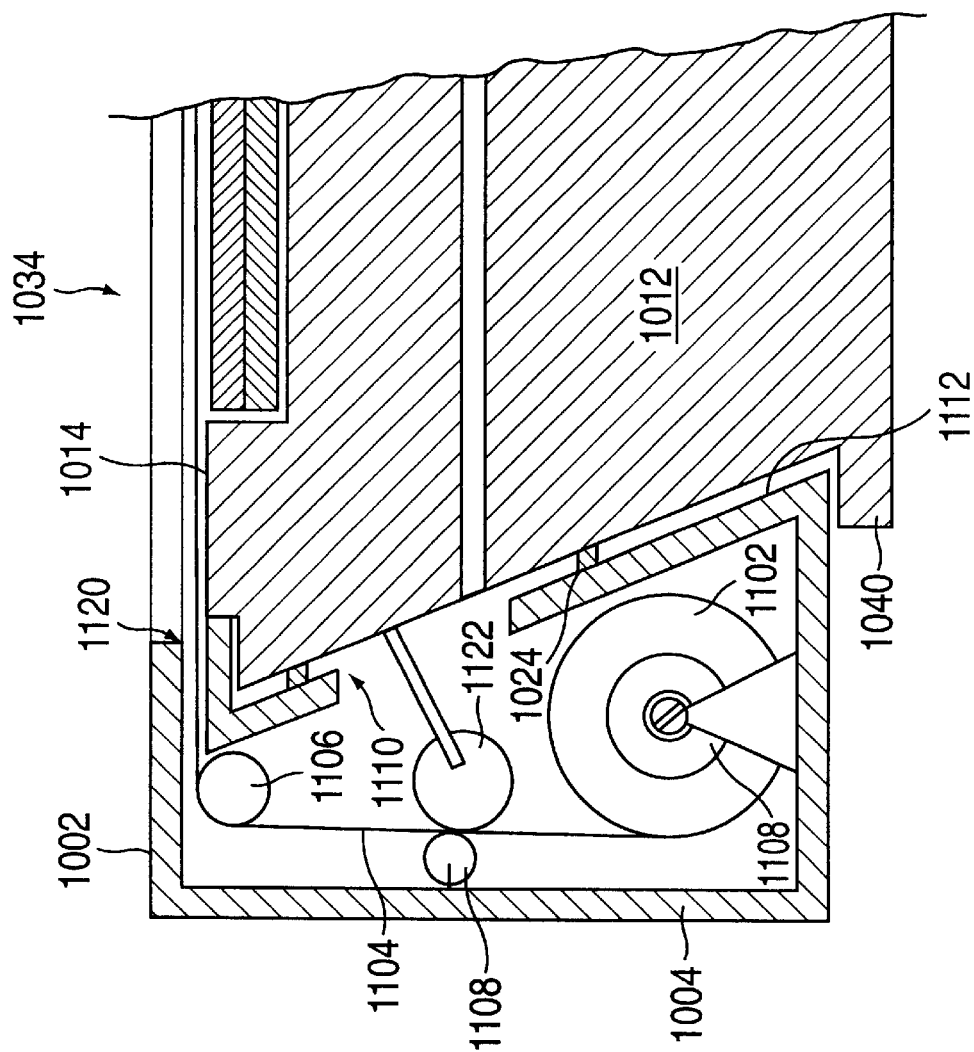
FIG. 11 is a sectional view of a first end of the polishing media cartridge of FIG. 10.
Figure 12:
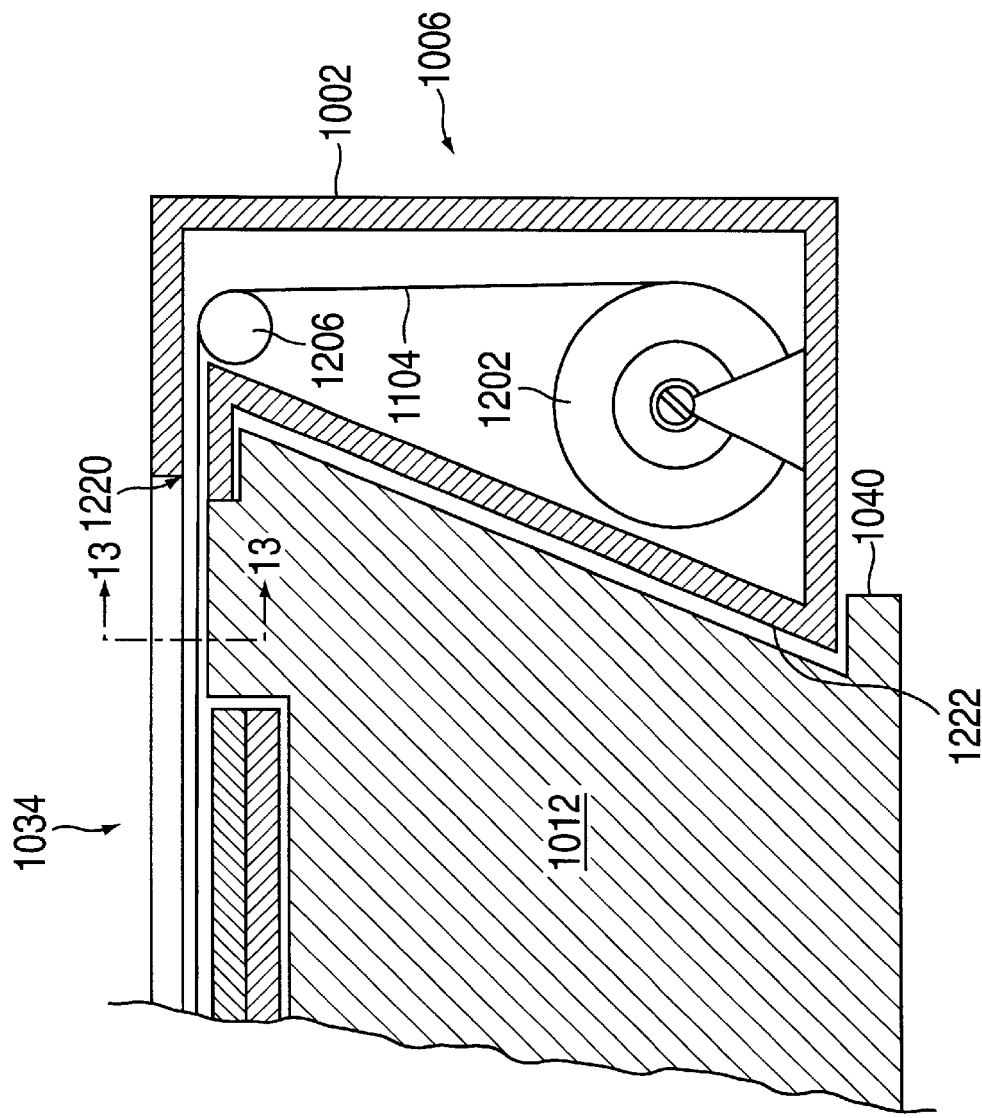
FIG. 12 is a sectional view of a second end of the polishing media cartridge of FIG. 10.

FIGS. 10, 11 and 12 depict another embodiment of a polishing media assembly 1000 that incorporates components of the unwind and take-up stations into a single, disposable or recyclable assembly. The polishing media assembly 1000 comprises a cartridge 1002 having a first end 1004 and a second end 1006 separated by a center section 1008 that is disposed on a top surface 1014 of a platen 1012 of a polishing station 1010. The cartridge 1002 is generally comprised of a recyclable material such as a plastic.

The first end 1004 comprises a shaft or unwind reel 1102 coupled to the cartridge 1002 on which a portion of a web 1104 of polishing material is wound. A first guide roller 1106 is coupled to the cartridge 1002 proximate the transition between the first end 1004 and the center section 1008. Optionally, the unwind reel 1102 may include a first roller and a second roller such that the web 1104 is wound to form a single roll about the first roller and the second roller. An idler 1208 is disposed in the first end 1004.

The first end 1004 additionally comprises an aperture 1110 disposed through an inner surface 1112 of the first end 1004. The aperture 1110 is configured to permit a drive wheel 1022 to extend into the first end 1004 and pinch the web 1104 against the idler 1208. The drive wheel 1022, in response to a signal from the controller 108, advances predetermined length of the web 1104 of polishing material to be unwound from the unwind reel 1102.

Generally, the platen 1012 includes a seal 1024 disposed on the platen 1012. The seal 1024 is adapted to interface with the inner surface 1112 of the first end 1004 and circumscribes the aperture 1020. The seal 1024 may comprise a gasket, brush or other means for minimizing the fluid flow between the platen 1012 and the cartridge 1002, such as an urethane foam gasket. A fluid port 1042 is disposed on the platen 1012 within the area circumscribed by the seal 1024. When fluid, such as air, is provided through the port 1042 into the first end 1004, at least a portion of the air flows out the aperture 1020 to prevent contaminants (i.e., polishing fluids, polishing byproducts and the like) from entering the first end 1004 of the assembly 1000.

The second end 1006 comprises a shaft or take-up reel 1202 on which the web 1104 of polishing material is wound after polishing. Generally, the bitter end of the web 1104 is coupled to the take-up reel 1202, and additional lengths of web 1104 are wound onto the take-up reel 1202 as the web 1104 is indexed and consumed (i.e., used) by the polishing process. Optionally, the take-up reel 1202 may include a first roller and a second roller (not shown) such that the web 1104 is wound in a single roll about the first and second rollers. The take-up reel 1202 is interfaced with a tensioning device 1204 disposed in the second end 1006 such that the web 1104 is maintained at a constant tension between the unwind and take-up reels 1024, 1202. When the web 1104 of polishing material is unwound from the unwind reel 1102, the tensioning device 1204 causes the polishing material to be wound upon the take-up reel 1202, thus indexing the polishing material across the top surface 1014 of the platen 1012. Optionally, the tensioning device 1204 may be an integral part (i.e., mounted to or within) of the second end 1006 and accessible for adjustment through an access hole 1020 in the second end 1006 of the cartridge 1002.

A second guide roller 1206 is disposed in the second end 1006 adjacent the center section 1008. The web 1104 is disposed between the first guide roller 1106 and the second guide roller 1206 such that the web 1104 is disposed generally coplanar to the top surface 1014 of the platen 1012.

Figure 13:
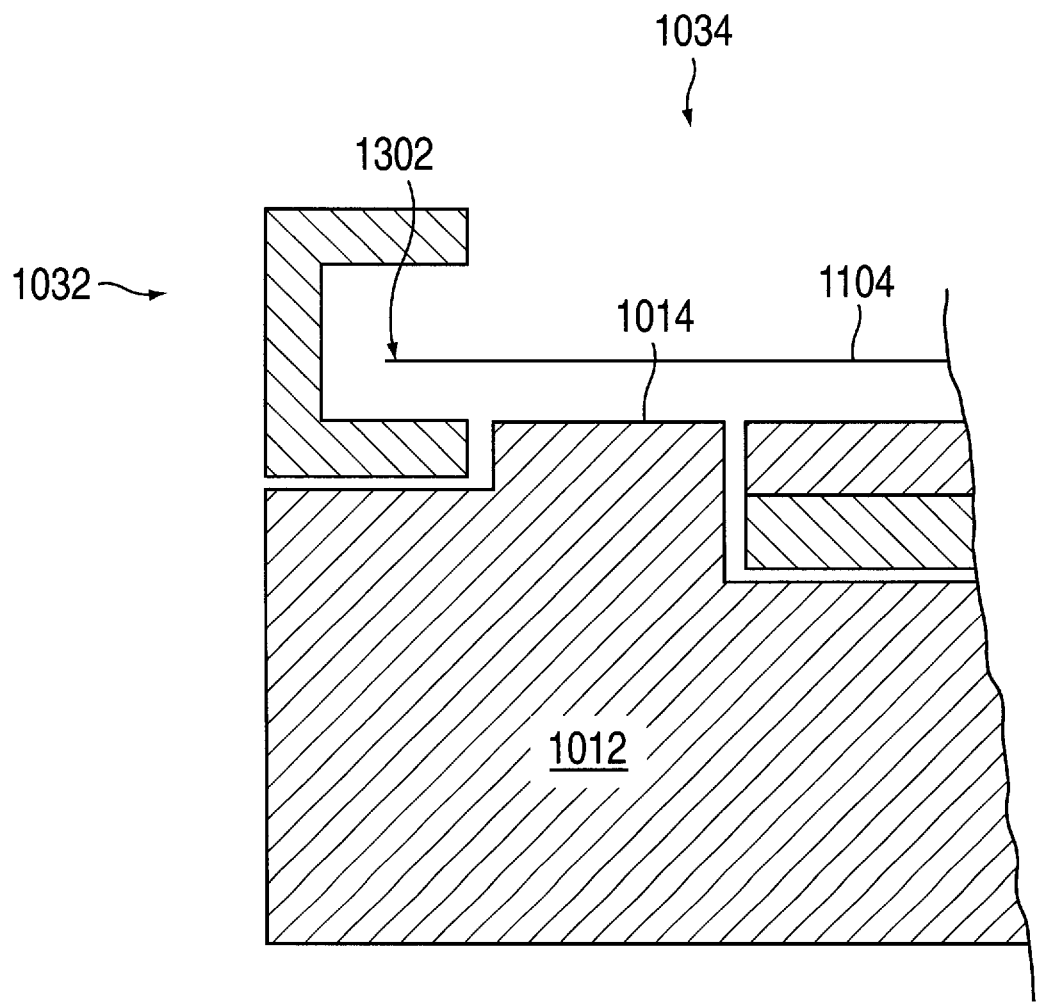
FIG. 13 is a sectional view of a center section of the polishing media cartridge of FIG. 10.
Figure 14A:
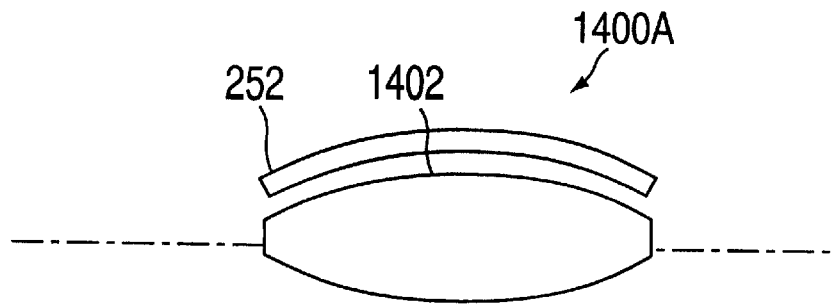
FIGS. 14A–D depict elevations of various embodiments of a roller.
Figure 14B:
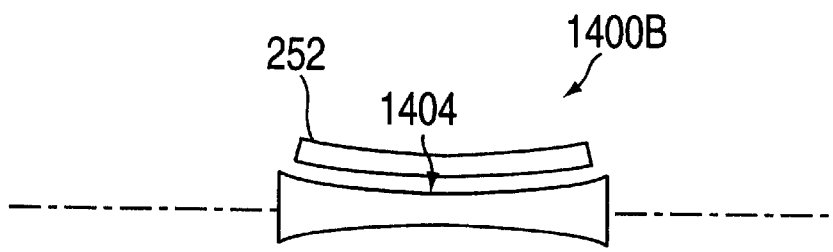
Figure 14C:
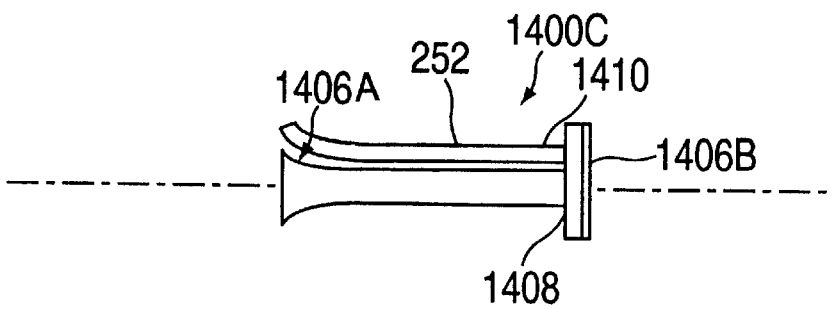
Figure 14D:
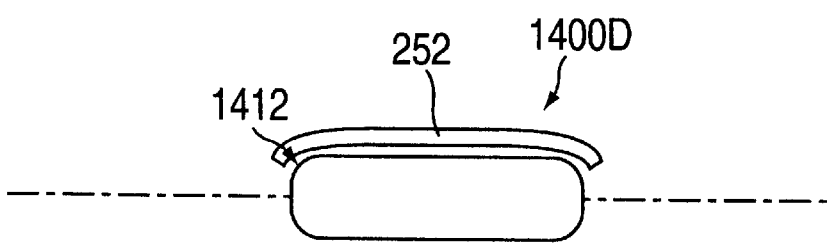

Referring additionally to FIG. 13, the center section 1008 of the cartridge 1002 comprises a first member 1030 and a second member 1032 that couple the first end 1004 to the second end 1006. The first member 1030 and the second member 1032 are generally parallel to each other and define a window 1034 therebetween. The first member 1030 and the second member 1032 have an inwardly facing, "C" shaped cross section that encloses an edge 1302 of the web 1104, thus guiding the web 1104 as it travels across the platen 1012. The first end 1004 and the second end 1006 each have an aperture 1020, 1120 that permits the interior of the first and second ends 1004, 1006 to communicate with the window 1034. The web 1104 passes from the first end 1004, between the first and second members 1030, 1032, and into the second end 1006. The window 1043 is configured to permit the web 1104 to be disposed on the platen 1012 (and subpad) while providing enough open area for the substrate 112 held by the polishing head assembly to travel in a predetermined polishing pattern.

The platen 1012 generally has a raised center section 1042 surrounded by a lower circumferential portion 1044. When the assembly 1000 is mounted to the platen 1012, the assembly 1000 (the first member 1030, and second member 1032) is disposed on the lower portion 1044 while the center section 1042 protrudes into the window 1043. The relative height of the center section 1042 and the lower portion 1044 is such that the web 1104 disposed between the first guide roller 1106 and the second guide roller 1206 is proximate to the top surface 1014 of the platen 1012.

The platen 1012 typically includes a ridge 1040 that supports the assembly 1000 when interfaced with the platen 1012. The ridge 1040 includes a notch 1046 that accepts a tab 1048 extending from the cartridge 1002. The tab 1048 and the notch 1046 may be present at both the first and the second ends 1004, 1006 of the assembly 1000 and platen 1012, respectively. The tab 1048 prevents the assembly 1000 from moving during the rotation of the platen 1012. The inner surface 1112 of the first end 1004 and an inner surface 1222 may be angled to "snap" over the platen 1012. The platen 1012 may additionally include latches, snap fits, clasps, hooks, screws and other attachment devices to retain the assembly 1000 to the platen 1012.

FIGS. 14A–D depict various alternative embodiments of rollers having a means for minimizing the lateral movement of the web 252 as the web 252 is advanced across the platen 230. The rollers may be utilized in one or more locations on the platen, or within a polishing media assembly. In one embodiment, the diameter of a roller 1400A at its center is greater than the roller diameter at the ends of the roller, forming a crown 1402. The crowned roller provides greater tension in the center of the roller such that the center of the web is induced to travel over the center of the roller. In another embodiment, a roller 1400B is concave across its width, having its smallest diameter in a center 1404. In another embodiment, a roller 1400C has flanged ends 1406A and 1406B that maintains the web 252 therebetween. The flanged end 1406A includes a protruding edge that permits the web 252 to ride at least partially thereon. The flange end 1406B includes a radially extending wall 1408 that prevents the web 252 from moving beyond the flange 1406B. In another embodiment, a roller 1400D includes a relief 1412, such as a rounded edge or chamfer at the ends of the roller 1400D. The edges of the web 252 that overlie the relief 1412 are tensioned along the length of the web 252 and prevent the web 252 from moving laterally while in motion.

In an other embodiment, a large inflated roller, the surface of which is a web material is provided. The large bladder or roller or tire is pressed down on the wafer and rubbed in a rotary fashion, similar to a tire on pavement, it will flatten off on the bottom of the wafer and provide a uniform downforce across the wafer. During rotation, it provides a linear motion pass the wafer. A mechanism is provided, e.g., sidewalls to provide a centering mechanism for pushing the tire down, or compressing the tire between two surfaces. Therefore, the tire is compressed between the wafer and the upper roller, so that it pushes down onto the wafer or on a number of rollers.

Referring to FIGS. 1 and 2, in operation, the substrate 122 is retrieved from one of the cassettes 118 by the interface robot 120. The interface robot 120 transfers the substrate 122 to the input module 124 where it is retrieved by the loading robot 104. The loading robot 104 transfers the substrate 122 to the transfer station 136 where the substrate 122 is loaded into one of the polishing heads 204. The carousel 134 positions the substrate 122 over one of the polishing stations 132. The drive system actuates to place the substrate 122 in contact with the polishing material. Both the polishing head and the polishing material rotate, while the drive system is oscillated along the arm 150 of the carousel 134, thus providing the polishing motion of the substrate 122 relative the polishing material 252.

During polishing, the various sensors provide the controller 108 with process information. For example, the sensor 704 provides the controller 108 with information regarding the temperature of the polishing process or substrate 122. Using the temperature information, the temperature of the fluids used in the bladder 602 and the channels 286 may be regulated to cause a change in the polishing process. For example, the fluid in the bladder 602 may be heated to increase the chemical activity between the polishing fluids and the substrate 122, thus increasing the polishing rate. Alternatively, the ratio of chemicals used during polishing (i.e., increase the ratio of cleting agents to inhibitors) may be changed to induce a faster polishing rate. Conversely, the polishing rate may be reduced in the opposite manner.

Once polishing is completed, the substrate 122 is removed from the polishing material and indexed to another polishing station or returned to the transfer station. Polished substrates 122 are retrieved from the transfer station by the loading robot 104 and transferred to the factory interface module 102 where the substrate 122 is cleaned and ultimately returned to one of the storage cassettes 118.

Although the teachings of the present invention that have been shown and described in detail herein, those skilled in the art can readily devise other varied embodiments that still incorporate the teachings and do not depart from the spirit of the invention.

What is claimed is:

1. Apparatus for semiconductor substrate polishing comprising:
    a polishing platen;
    a web of polishing material having at least a first portion disposed on the polishing platen; and
    a shield member disposed adjacent the polishing platen and defining a slot there between, the web disposed through the slot.

2. The apparatus of claim 1, wherein the shield member further comprises:
    a wiper, the web disposed between the wiper and the platen.

3. Apparatus for semiconductor substrate polishing comprising:
    a polishing platen;
    a web of polishing material having at least a first portion disposed on the polishing platen;
    a polishing head disposed proximate the platen and having a conventional polishing motion therebetween; and
    a vibrational energy source having a predetermined frequency and adapted to provide a movement between the polishing head and the platen in addition to the conventional polishing motion.

* * * * *

UNITED STATES PATENT AND TRADEMARK OFFICE
CERTIFICATE OF CORRECTION

PATENT NO.    : 6,413,873 B1  
DATED         : July 2, 2002  
INVENTOR(S)   : Li et al.

It is certified that error appears in the above-identified patent and that said Letters Patent is hereby corrected as shown below:

Column 5,  
Line 22, please change "(not show)" to -- (not shown) --.  
Line 25, please change "to seal" to -- the seal --.  
Line 49, please delete "The shaft 238".

Column 6,  
Line 20, please change "against an drive" to -- against a drive --.  
Line 37, please change "roller 170" to -- roller 270 --.

Column 9,  
Line 23, please change "The each" to -- Each --.  
Line 38, please delete "the".

Column 10,  
Line 11, please change "energy relate" to -- energy relative --.  
Line 13, please change "coupled polishing" to -- coupled to polishing --.  
Line 25, please change "product" to -- produce --.  
Line 46, please change "Therefore, the" to -- Therefore, as the --.

Column 11,  
Line 13, please change "coupled the" to -- coupled to the --.

Column 13,  
Line 23, please change "maintains" to -- maintain --.  
Line 50, "The carousel 134..." should begin a new paragraph.

Signed and Sealed this

Thirty-first Day of December, 2002

JAMES E. ROGAN  
*Director of the United States Patent and Trademark Office*